(12) United States Patent
Williams

(10) Patent No.: US 8,315,819 B1
(45) Date of Patent: Nov. 20, 2012

(54) METHOD AND APPARATUS FOR DETERMINING DOPANT DENSITY IN SEMICONDUCTOR DEVICES

(75) Inventor: Clayton Covey Williams, Salt Lake City, UT (US)

(73) Assignee: Agilent Technologies, Inc., Santa Clara, CA (US)

( * ) Notice: Subject to any disclaimer, the term of this patent is extended or adjusted under 35 U.S.C. 154(b) by 357 days.

(21) Appl. No.: 12/566,940

(22) Filed: Sep. 25, 2009

(51) Int. Cl.
*G01N 31/00* (2006.01)
*H01L 23/58* (2006.01)

(52) U.S. Cl. .......................................... 702/23; 257/48
(58) Field of Classification Search .................. 702/23, 702/137; 324/765, 158.1; 257/48, E21.524
See application file for complete search history.

(56) References Cited

U.S. PATENT DOCUMENTS

| 7,372,025 B2 | 5/2008 | Hoen et al. | |
|---|---|---|---|
| 2002/0033708 A1* | 3/2002 | Weiss et al. | 324/765 |
| 2008/0099761 A1* | 5/2008 | Feustel et al. | 257/48 |
| 2009/0084952 A1* | 4/2009 | Rutgers et al. | 250/307 |
| 2009/0100554 A1 | 4/2009 | Arnold et al. | |

OTHER PUBLICATIONS

A. Erickson, "Scanning Capacitance Microscopy," MultiProbe, 2007, www.multiprobe.com, pp. 1-4.

* cited by examiner

*Primary Examiner* — Byran Bui

(57) ABSTRACT

A method and apparatus generate a measured data set by: (i) providing a probe tip at a selected height from a doped region of a substrate, (ii) applying a probing signal to the probe tip, (iii) measuring a characteristic of an electrical interaction between the probe tip and the doped region of the substrate, and (iv) repeating steps (i) through (iii) for a plurality of different selected heights. A plurality of reference data sets are provided characterizing the electrical interaction between the probe tip and the doped region of the substrate as a function of height between the probe tip and the doped region of the substrate. Each data set corresponds to a different dopant density. The measured data set is compared to the plurality of reference data sets and based on the comparison, the dopant density of the doped region of the substrate is determined.

20 Claims, 12 Drawing Sheets

METHOD AND APPARATUS FOR DETERMINING DOPANT DENSITY IN SEMICONDUCTOR DEVICES

BACKGROUND

In semiconductor manufacturing, doping is the process of intentionally introducing impurities into a semiconductor material to change its electrical properties. The electrical performance of doped semiconductor devices will change depending on the doping density and profile. There are therefore a number of techniques to try to determine the dopant concentration in a solid consisting mainly of semiconductor material.

One class of techniques employs principles of atomic force microscopy (AFM). An atomic force microscope consists of a microscale cantilever with a sharp conductive tip (probe) at its end that is used to scan a specimen surface. The cantilever is typically silicon or silicon nitride with a tip that is covered with a conductive material and which typically has a radius of curvature on the order of nanometers.

One technique for detecting doping is scanning capacitance microscopy (SCM). Scanning capacitance microscopy (SCM) is a type of scanning probe microscopy in which a sharp probe electrode is held near or on the surface of a sample and scanned across the sample. SCM characterizes the surface of the sample using information obtained from the change in differential capacitance between the surface and the probe. More precisely SCM uses an ultra-sharp conducting probe (often Pt/Ir or Co/Cr metal covering an etched silicon probe) to form a metal-insulator-semiconductor (MIS/MOS) capacitor with a semiconductor sample if an oxide is present. When no oxide is present, a Schottky contact/capacitor is formed. When the probe and surface are in contact, an AC bias is applied, generating capacitance variations in the sample which can be detected using a GHz resonant capacitance sensor or other means. The tip is then scanned across the semiconductor's surface in 2D while the tip's height is controlled by conventional contact force feedback.

By applying an alternating bias to the metal-coated probe, carriers alternately accumulate and deplete within the semiconductor's surface, changing the tip-sample capacitance. The magnitude of this change in capacitance with the applied voltage gives information about the concentration of carriers (SCM amplitude data), whereas the difference in sign of the capacitance change relative to the applied, alternating bias carries information about the sign of the charge carriers. Because SCM functions even through an insulating layer, a finite conductivity is not required to measure the electrical properties.

When the SCM tip is brought into close proximity with the sample surface a Metal/Oxide/Semiconductor (MOS) capacitor is formed between them, where: M is the metal probe, S is the semiconductor material and O is a thin dielectric formed on the semiconductor surface. Free carriers within the sample are able to move under the influence of an AC electric field applied by the conductive probe (tip). The capacitance measured by the SCM sensor varies as the carriers move towards (accumulation) and away from (depletion) the probe. When the sample is fully depleted the measured capacitance is that of the oxide plus the depletion layer. When carriers are accumulated at the surface, the measured capacitance is that of the oxide layer. This capacitance variation in response to the tip-applied field forms the basis of the SCM measurement. Movement of free carriers and hence the amplitude of the capacitance variation is a function of the dopant level of the sample directly beneath the probe. For heavily doped materials the carriers do not move far. Hence, the measured capacitance variation between accumulation and depletion is small. The opposite is true for lightly doped semiconductors which yield a large capacitance change.

However in general these techniques can only provide indications of the relative dopant concentrations in a device, but they cannot measure the absolute dopant densities in semiconductor devices, particularly not in small regions when the dopant density varies over such regions of a wafer.

What is needed, therefore, are new methods for determining absolute dopant densities in semiconductor devices.

SUMMARY

In an example embodiment, a method includes generating a measured data set, by: (i) providing a probe tip at a selected height from a doped region of a substrate, (ii) applying a probing signal to the probe tip, (iii) measuring a characteristic of an electrical interaction between the probe tip and the doped region of the substrate, and (iv) repeating steps (i) through (iii) for a plurality of different selected heights. The method further includes: providing a plurality of reference data sets characterizing the electrical interaction between the probe tip and the doped region of the substrate as a function of height between the probe tip and the doped region of the substrate, each reference data set corresponding to a different dopant density; comparing the measured data set to the plurality of reference data sets; and determining a dopant density of the doped region of the substrate from the comparison.

In another example embodiment, an apparatus comprises: a probe tip provided on a cantilever arm; a control device configured to move the probe tip with respect to a doped region of a substrate; a signal processing device configured to apply a probing signal to the probe tip and to sense an electrical interaction between the probe tip and the doped region; and a processor configured to control the apparatus to perform an algorithm. The algorithm includes generating a measured data set by: (i) moving the probe tip at a selected height from a doped region of a substrate, (ii) applying the probing signal to the probe tip, (iii) measuring a characteristic of an electrical interaction between the probe tip and the doped region of the substrate, and (iv) repeating steps (i) through (iii) for a plurality of different selected heights. The algorithm further includes providing a plurality of reference data sets characterizing the electrical interaction between the probe tip and the doped region of the substrate as a function of height between the probe tip and the doped region of the substrate, each reference data set corresponding to a different dopant density; comparing the measured data set to the plurality of reference data sets; and determining a dopant density of the doped region of the substrate from the comparison.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

Figure 1:
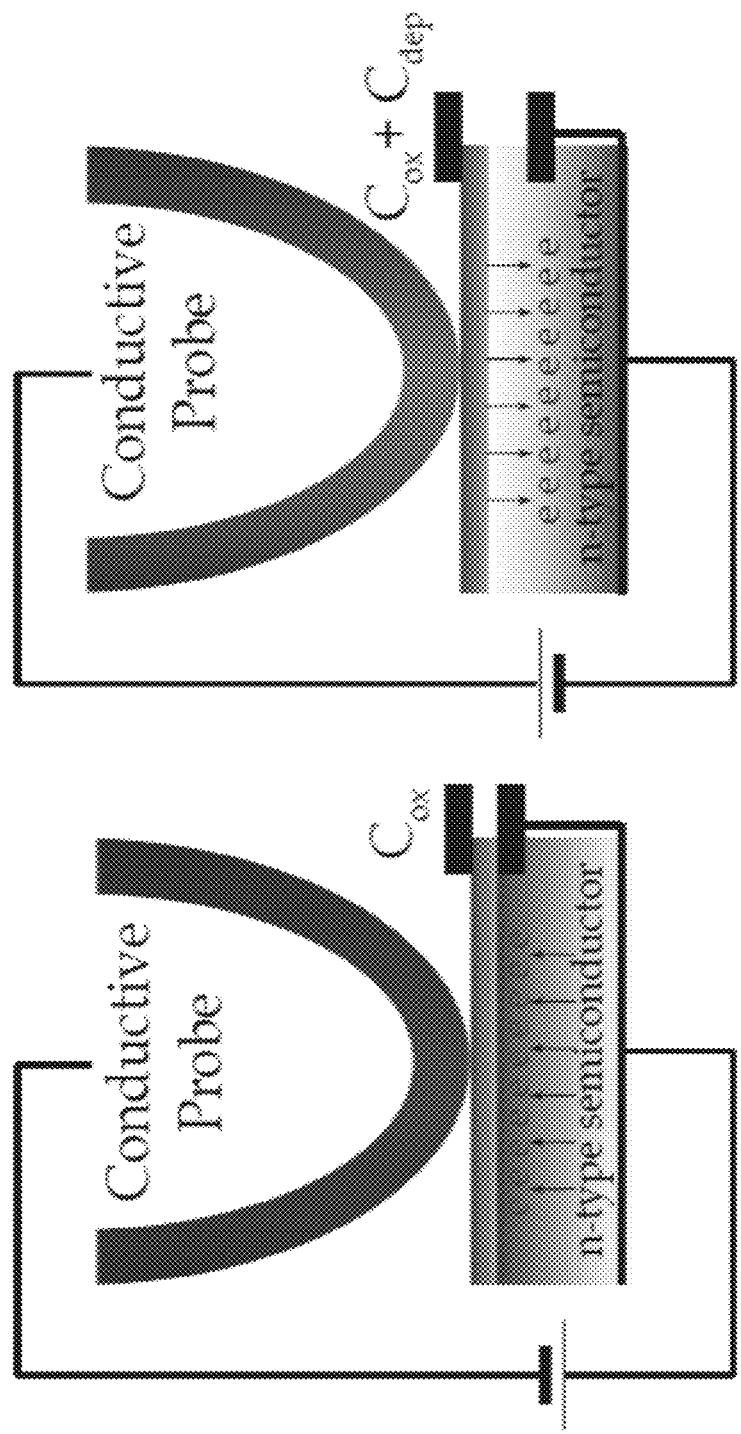
FIG. 1 illustrates principles of scanning capacitance microscopy (SCM) and scanning microwave microscopy (SMM).

FIG. 1 illustrates principles employed by scanning capacitance microscopy (SCM) and scanning microwave microscopy (SMM) to determine information about doping concentrations in semiconductor devices.

FIG. 1 illustrates a conductive probe tip applying a voltage across a semiconductor substrate having an oxide layer formed thereon, and carriers doped therein. As shown on the left hand side of FIG. 1, when the probe tip applies the voltage having a first polarity, the majority carriers are driven toward the probe tip at the top of the substrate. In contrast, as shown on the right hand side of FIG. 1, when the probe tip applies the voltage having a second polarity, the carriers are driven away from the probe tip into the substrate. In FIG. 1, a capacitance is created between the probe tip and the edge of the majority carriers, with the oxide layer serving as the capacitor dielectric in the accumulation case shown on the left hand side of FIG. 1, and the oxide layer and the top part of the semiconductor substrate serving as the capacitor dielectric in the depletion case shown on the right hand side of FIG. 1.

Meanwhile, the capacitance between two plates of a capacitor is given by:

$$C = \epsilon A/t \quad (1)$$

where: $\epsilon$ is the dielectric constant, A is the area of the capacitor, and t is the spacing between the plates, where $t \ll \sqrt{A}$.

Therefore the capacitance in FIG. 1 is higher in the accumulation state shown on the left side when the "plates" are closer together, and lowest in the depletion state shown on the right side when the "plates" are further apart. For n-type material the measured capacitance is therefore highest when the applied voltage is positive. The capacitance decreases as the bias is shifted negative as a result of free carriers being pushed away from the surface, analogous to an increase in the plate separation. Movement of free carriers and hence the amplitude of the capacitance variation is a function of the dopant level of the region of the substrate directly beneath the probe tip. For heavily doped materials the carriers do not move far. Hence, the measured capacitance variation between accumulation and depletion is small. The opposite is true for lightly doped semiconductors which yield a large capacitance change.

The principles described above with respect to FIG. 1 may be employed in scanning capacitance microscopy and scanning microwave microscopy to determine information about dopant concentration levels in a semiconductor substrate.

It can be understood from the above discussion that the capacitances in depletion state and the accumulation state are also a function of the distance or height between the probe tip and the doped region of the substrate with the surface oxide formed thereon. In particular, as the probe tip is moved further away from the doped region of the substrate, the capacitance decreases—in both accumulation and depletion modes. Also, the change in capacitance between the accumulation state and the depletion state, and the ratio between the accumulation capacitance and the depletion capacitance, will vary as a function of the distance or height between the probe tip and the surface of the substrate. In a typical implementation, the substrate being measured is oriented horizontally, and so the probe tip is positioned at a desired vertical distance—or height—above the substrate. However it is conceivable that other orientations may be employed. Nevertheless, for simplicity of explanation, throughout this disclosure the distance between the probe tip and the substrate will be referred to using the term "height," with the understanding that this term is intended to pertain to other arrangements besides those where the substrate being measured is oriented horizontally and the probe tip is positioned vertically above it.

In general, an electrical interaction between the probe tip and the doped region of the substrate is dependent upon the height between the probe tip and the top surface of the substrate. Also, the dependency of this interaction on the height will change depending upon the dopant density in the doped region. This principle may be employed to make capacitance or SMM reflectance measurements with a probe tip at various heights to directly measure the local dopant density. Furthermore, this provides a way to normalize signal measurements to reduce significantly the dependence on the radius of the probe tip, the oxide thickness, and other parameters.

Figure 2:
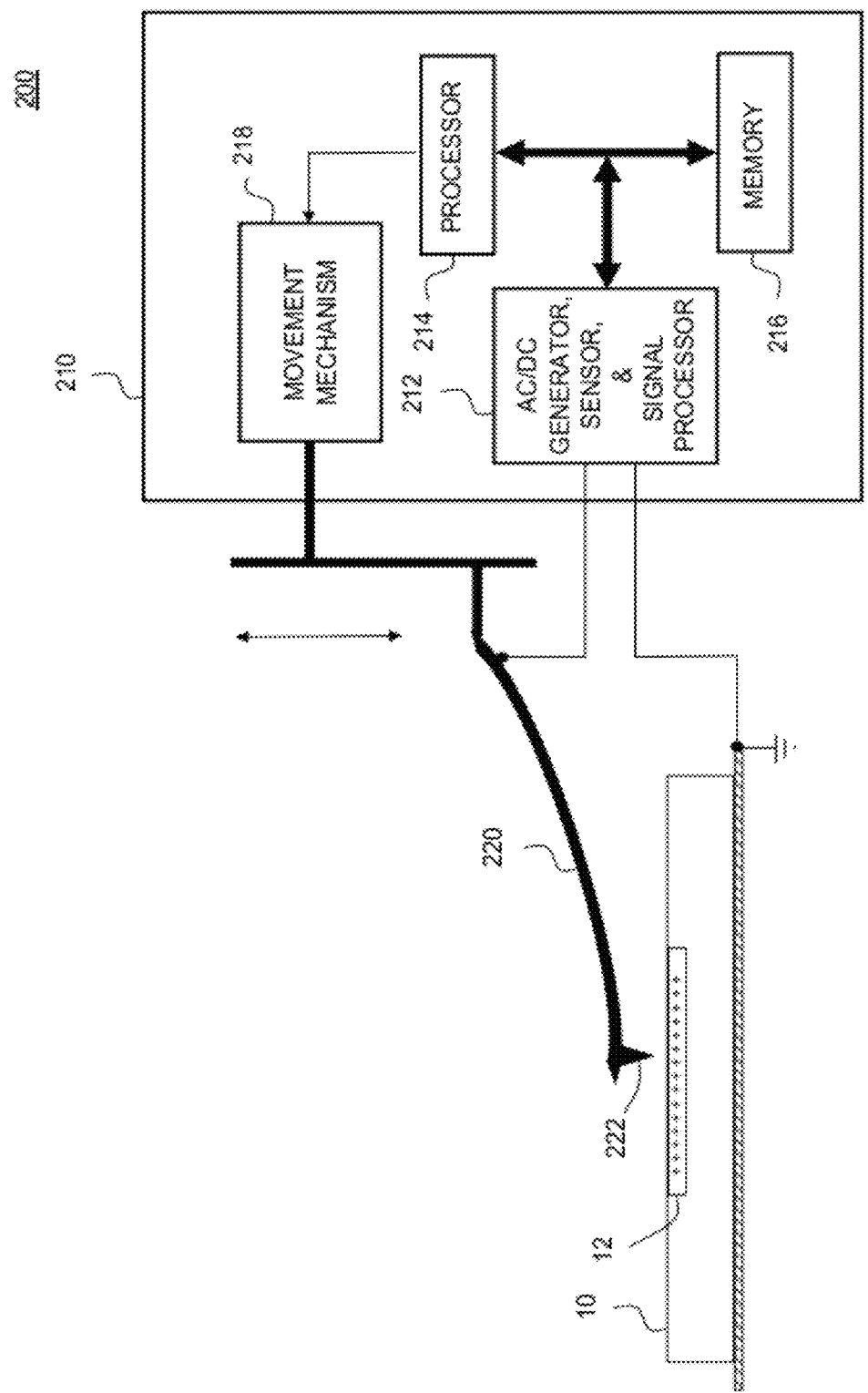
FIG. 2 is a functional block diagram of one embodiment of a scanning microwave microscopy (SMM) instrument.

FIG. 2 is a functional block diagram of one embodiment of a measurement instrument 200 for measuring a doping density in a doped region 12 of a substrate 10. As will be appreciated by those skilled in the art, one or more of the various "parts" shown in FIG. 2 may be physically implemented using a software-controlled microprocessor, hard-wired logic circuits, or a combination thereof. Also, while the parts are functionally segregated in FIG. 2 for explanation purposes, they may be combined variously in any physical implementation.

Instrument 200 includes a measurement system 210 and a cantilever arm 220 with a probe tip 222. Instrument 200 is of course but one exemplary embodiment, and other structural arrangements besides a cantilever arm (e.g., a tuning fork) may be provided for holding a probe tip within a close vicinity of a surface of a substrate region whose doping density is to be measured. It should also be understood that it is important in instrument 200 to precisely position probe tip 222 at various relatively small heights above substrate 100, including maintaining and measuring the position of probe tip 222. Beneficially, instrument 200 also includes some form of displacement sensor, such as a laser diode and light detector, (not shown in FIG. 2) for detecting the position or displacement of the probe tip from the surface of the substrate 10. In some embodiments, such an arrangement may provide feedback to measurement system 210 for controlling the position of probe tip 222.

Measurement system 210 includes an AC & DC signal generator, sensor, and signal processor block 212, a control processor 214, memory 216, and a movement mechanism (e.g., a motor and/or a piezoelectric transducer) 218 or other means for moving probe tip 222 perpendicularly with respect to the top surface or doped region 12 of a substrate 10.

Processor 214 is configured to execute one or more software algorithms in conjunction with memory 216 to provide functionality for instrument 200. Beneficially, processor 214 includes its own memory (e.g., nonvolatile memory) for storing executable software programming code that allows it to perform the various functions of instrument 200. Alternatively, or additionally, executable code may be stored in designated memory locations within memory 216.

Memory 216 stores data and/or software programming code used in operations of instrument 200.

Figure 3:
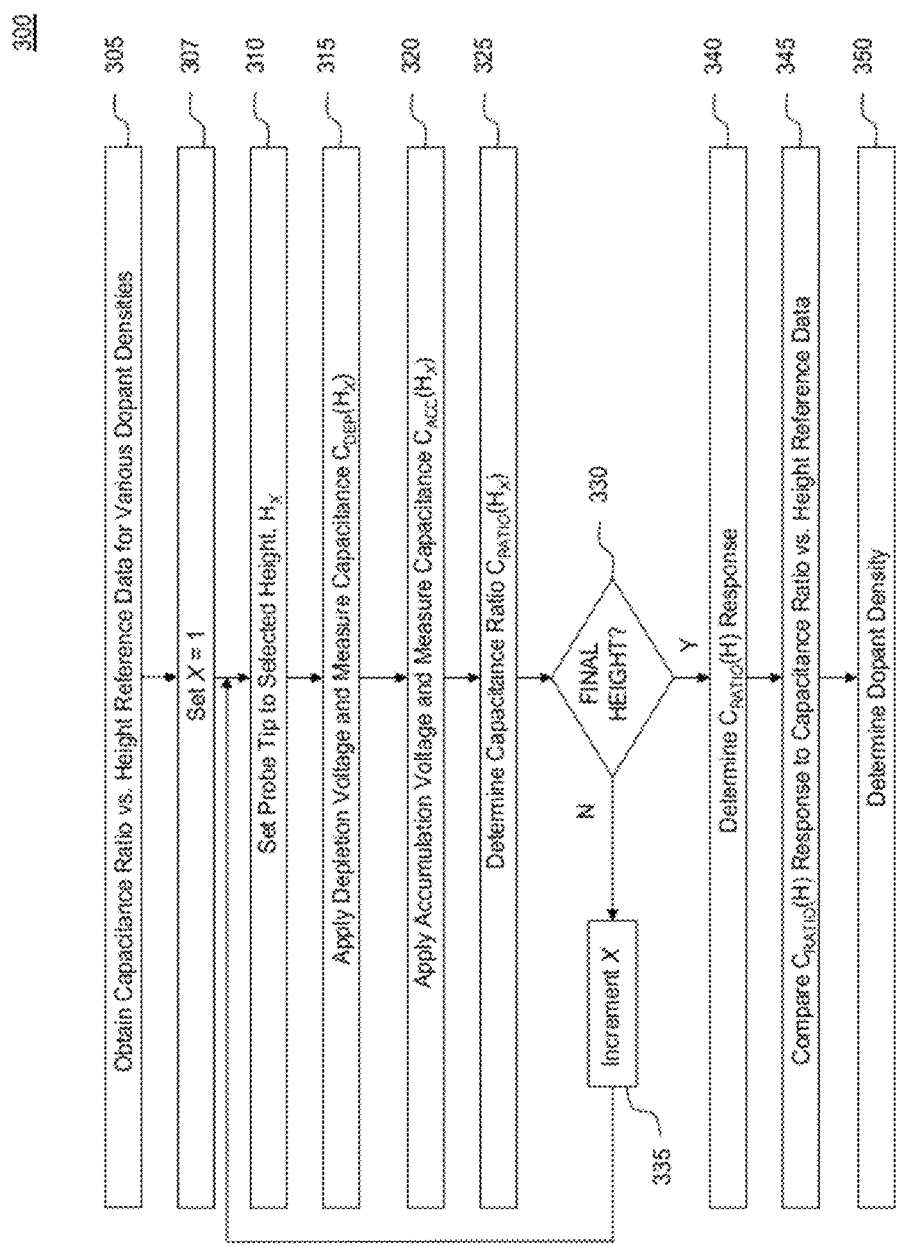
FIG. 3 is a flowchart of a first embodiment of a method of determining a dopant density.

FIG. 3 is a flowchart of a first embodiment of a method 300 of determining a dopant density. Method 300 may be executed by instrument 200 under control of processor 214. In method 300, localized probe tip/sample capacitance versus height measurements are made under different biasing conditions. Capacitance ratio ($C_{RATIO}$) versus height (H) data, $C_{RATIO}$(H), is then produced by dividing the absolute value of the measured probe tip capacitance with a depletion voltage applied, by the measured probe tip capacitance with an accumulation voltage applied:

$$C_{RATIO}(H) = C_{DEP}(H)/C_{ACC}(H) \quad (2)$$

The measured capacitance ratio versus height data, $C_{RATIO}$(H), is then compared to capacitance ratio versus height reference data previously determined for a variety of different dopant densities to determine the absolute dopant density of the region of the sample substrate on which the measurements are performed. Using the capacitance ratio can significantly reduce the dependence of the measurements on tip radius, oxide thickness, probe top cone angle, applied voltage (if voltages are large enough), etc.

Specifically, in a first step 305, capacitance ratio versus height reference data is obtained for various dopant densities upon a set of parameters which match parameters under the capacitance versus height data of a sample are to be measured. The reference data can be provided in the form of a series of data points, as a curve, as an equation, or in any other convenient form.

In one embodiment, the capacitance ratio versus height reference data may be determined from a software model of the interaction between the probe tip and the doped substrate region. Beneficially, the model employs parametric values for the radius for the probe tip, the cone angle of the probe tip, an applied accumulation voltage, an applied depletion voltage, and an oxide thickness between the probe tip and the doped region of the substrate.

In another embodiment, the capacitance ratio versus height reference data may be determined by making measurements of one or more reference substrates having a known doping density. For example, a large number of measurements may be made—at different heights—over different areas of a reference substrate having a substantially uniform, known, doping density, and the measurements may be averaged to produce capacitance ratio versus height reference data.

Figure 4:
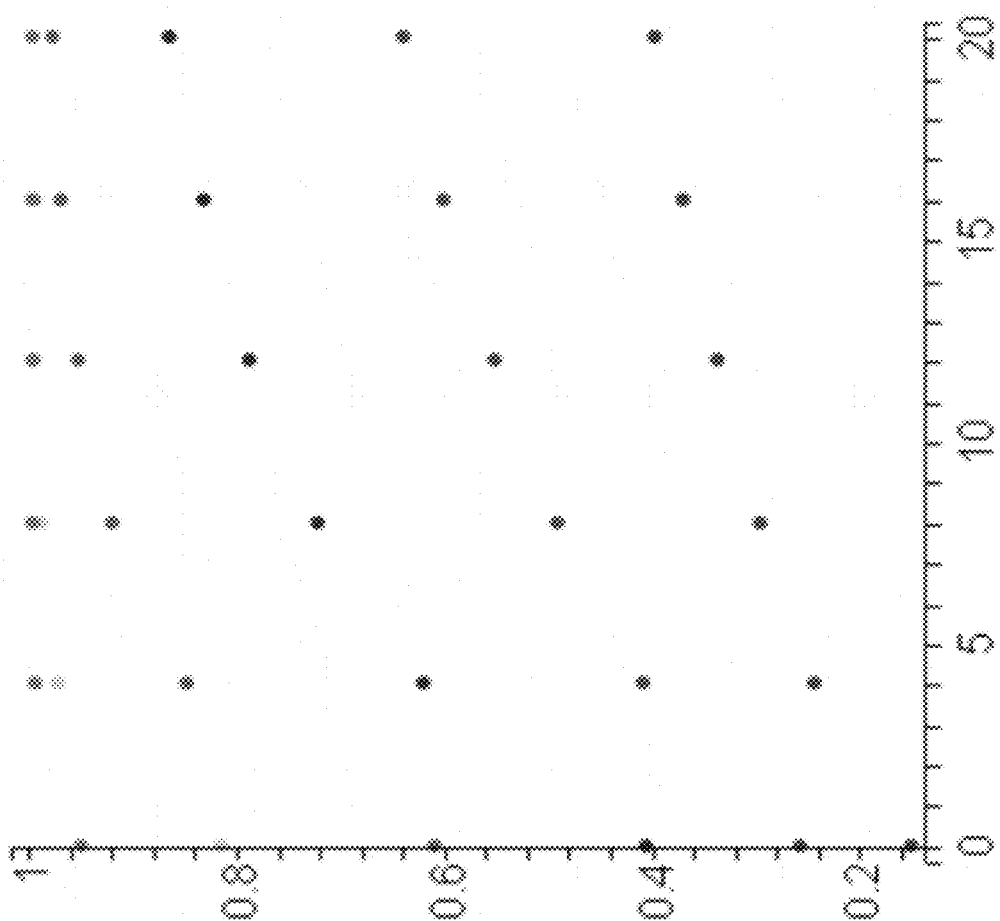
FIG. 4 illustrates a series of normalized capacitance vs. height curves for various dopant densities.

FIG. 4 illustrates an example series of capacitance ratio vs. height curves for various dopant densities that may be employed in method 300. The parameter set employed in the calculating the data plotted in FIG. 4 include: [Va, Na, tox, R, alpha], where Va is the amplitude of the applied accumulation and depletion voltage, Na is the log of the dopant density (in this example, p-type), tox is the oxide thickness above the doped region (dielectric constant k=3.8), R is the radius of the probe tip, and alpha is the probe cone angle. In the data sets plotted in FIG. 4, Va=5V, tox=3 nm, R=50 nm; and alpha=10 degrees. FIG. 4 plots values for six different data sets corresponding to six different dopant densities where Na is 15, 16, 17, 18, 19 and 20. In FIG. 4, the horizontal axis is in nanometers, ranging from 0 to 20 nm, and the vertical axis is unitless, since all data is normalized.

As can be seen, there is a nice separation of the data between all six normalized data sets. Beneficially, the data plotted in FIG. 4 could be stored in memory 216 of instrument 210.

Turning back to FIG. 3, in a step 307, a height/measurement index "X" is set to 1.

In a step 310, the probe tip is moved by a probe tip movement mechanism (e.g., a motor and/or piezoelectric transducer) to a predetermined height from the doped region of a substrate to be measured, corresponding to the index ("X"). For example, the first height (X=1) may be set to 0 nm.

In a step 315, a depletion voltage (e.g., +5V for p-type dopants) is applied to probe tip 222, and the capacitance $C_{DEP}(H_X)$ between probe tip 222 and the "plate" formed by the doped carriers is measured by AC & DC signal generator, sensor, and signal processor block 212.

Then, in a step 320, an accumulation voltage (e.g., −5V for p-type dopants) is applied to probe tip 222, and the capacitance $C_AMH_X$) between probe tip 222 and the "plate" formed by the doped carriers is measured by AC & DC signal generator, sensor, and signal processor block 212.

In step 325, a capacitance ratio $C_{RATIO}(H_X)$ is determined (e.g., by processor 214) according to equation (2) above.

In step 330, a check is made to determine whether measurements at the final height have been made. If not the process increments the height/measurement index "X" at step 335, and returns to step 310. In a beneficial arrangement, measurements may be made up to a final height of 20 nm.

Once measurements have been made at all desired heights, then the process proceeds to step 340 where the measured $C_{RATIO}$(H) response is determined for the dopant density in the doped region of a substrate being measured.

In step 345, the measured $C_{RATIO}$(H) response is compared to the capacitance ratio vs. height reference data from step 310, and in step 350, the dopant density in the doped region of a substrate being measured is determined from the comparison. For example, the measured $C_{RATIO}$(H) response could be plotted on the graph of FIG. 4 to determine the doped density of the measured sample. Alternatively, the comparison and determination could be performed entirely numerically by processor 214 without generating any plots.

Of course details illustrated in method 300 are exemplary. For example, measurements over a range from 0 to 20 nm may not be necessary in all cases to determine the dopant density. In other cases, more measurements and/or a larger height range may be employed. It should also be understood that the order of some of the steps illustrated in FIG. 3 can be rearranged in other orders for convenience. For example: step 305 could be performed after steps 307-335; the order of steps 315 and 320 could be interchanged; step 325 could be performed immediately prior to step 340; etc.

One challenge in the execution of method 300 is the separation out of stray capacitances, such as capacitance due to the probe tip shank and the cantilever, from the capacitance that is desired to be measured under the probe tip. If the changes in stray capacitance as a function of height are small compared to the changes in capacitance between the probe tip and the doped region as a function of height, then this challenge is not significant. In other cases, where the changes in stray capacitance as a function of height are of the same order or larger than the changes in capacitance between the probe tip and the doped region as a function of height, then an additional step is required for measuring the change in the stray capacitance as a function of height, and subtracting this value out of the measured total change in capacitance as a function of height, leaving only the change in capacitance between the probe tip and the doped region as a function of height.

Figure 5:
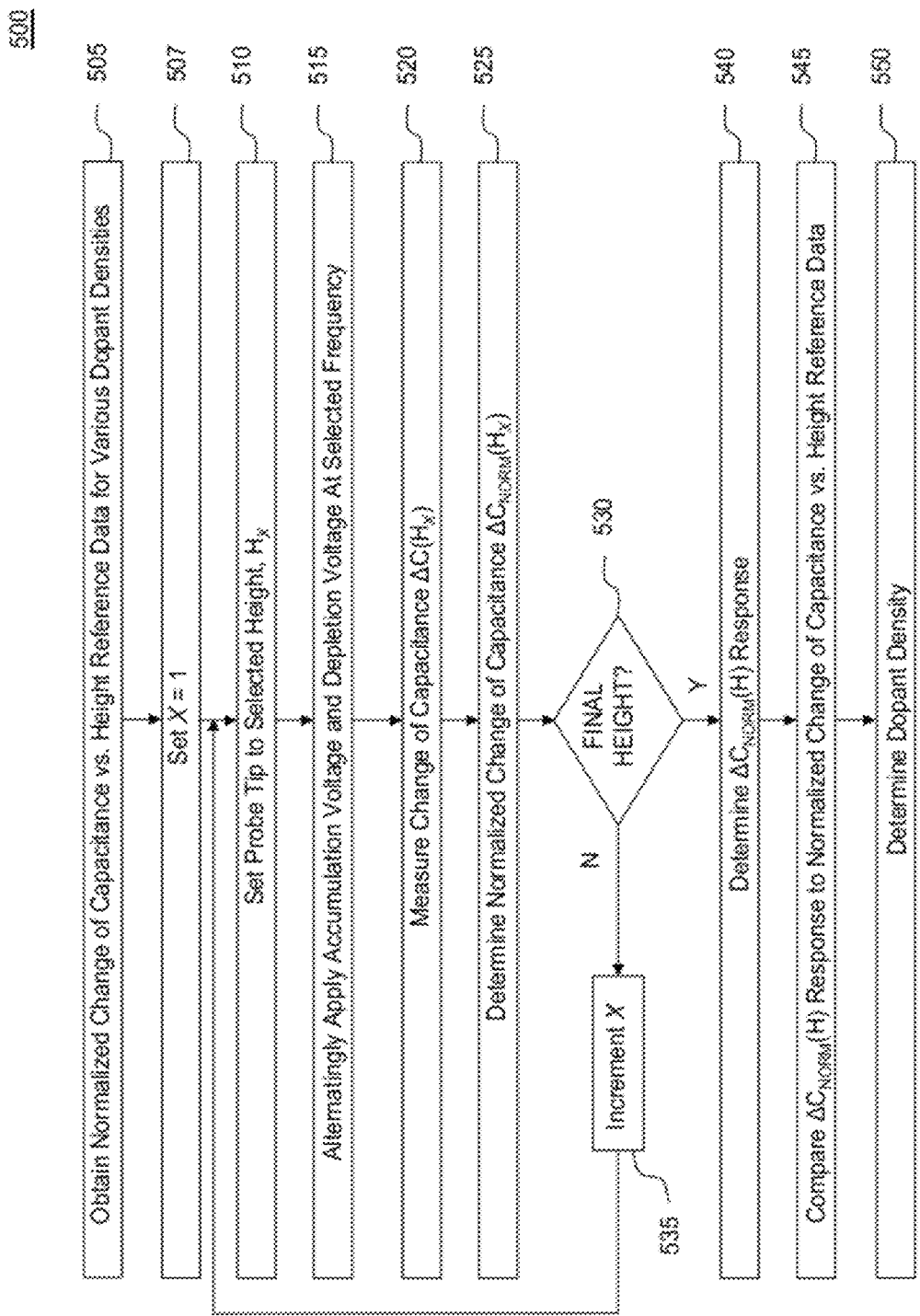
FIG. 5 is a flowchart of a second embodiment of a method of determining a dopant density.

FIG. 5 is a flowchart of a second embodiment 500 of a method of determining a dopant density. Method 500 may be executed by instrument 200 under control of processor 214. Method 500 illustrates one example of an approach to avoid the stray capacitance challenge discussed. Method 500 operates by measuring the change in capacitance as the probe tip goes from a strong accumulation voltage to a strong depletion voltage, as a function of height. Since the stray capacitance in many cases does not strongly depend on the applied voltage, this isolates the signal ΔC to the capacitance between the probe tip and the doped region of the substrate that is being measured. In method 500, strong accumulation and depletion voltages are typically applied with some frequency, e.g., 10-50 kHz, and the capacitance change between the accumulation and depletion states is measured, e.g., with a lock-in amplifier in AC & DC signal generator, sensor, and signal processor block 212. This change of capacitance, ΔC, is measured at several different heights between the probe tip and the doped region of the substrate that is being measured. These data samples are normalized by the value of ΔC when the height is zero, to produce normalized change of capacitance data, $\Delta C_{NORM}(H)$:

$$\Delta C_{NORM}(H) = \Delta C(H)/\Delta C(0) \quad (3)$$

Measured normalized change-of-capacitance (ΔC) versus height (H) data, $\Delta C_{NORM}(H)$, is then compared to normalized ΔC vs. H reference data for a variety of different dopant densities to determine the absolute dopant density of the region of the sample substrate on which the measurements are being performed.

Specifically, in a first step 505, normalized change of capacitance versus height reference data is obtained for various dopant densities. The reference data can be provided in the form of a series of data points, as a curve, as an equation, or in any other convenient form. The reference data may be obtained using techniques similar to those described above with respect to FIG. 3.

Figure 6:
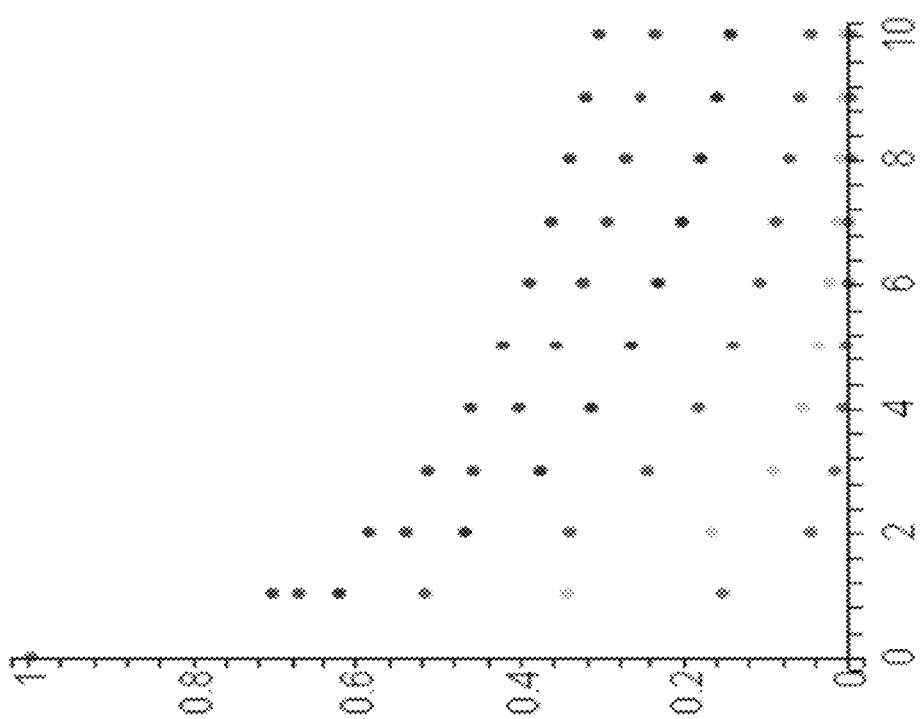
FIG. 6 illustrates a series of normalized change of capacitance vs. height curves for various dopant densities.

FIG. 6 illustrates an example series of normalized change of capacitance vs. height curves for various dopant densities that may be employed in method 500. The parameter set employed in the calculating the data plotted in FIG. 6 include: [Va, Na, tox, R, alpha], where Va is the amplitude of the applied accumulation and depletion voltage, Na is the log of the dopant density (in this example, p-type), tox is the oxide thickness above the doped region (dielectric constant k=3.8), R is the radius of the probe tip, and alpha is the probe cone angle. In the data sets plotted in FIG. 6, Va=5V, tox=1.5 nm, R=30 nm; and alpha=10 degrees. FIG. 6 plots values for six different data sets corresponding to six different dopant densities where Na is 15, 16, 17, 18, 19 and 20. In FIG. 6, the horizontal axis is in nanometers, ranging from 0 to 10 nm, and the vertical axis is unitless, since all data is normalized.

Turning back to FIG. 5, in a step 507, a height/measurement index "X" is set to 1.

In a step 510, the probe tip is moved by a probe tip movement mechanism (e.g., a motor and/or piezoelectric transducer) to a predetermined height from the doped region of a substrate to be measured, corresponding to the index ("X"). For example, the first height (X=1) may be set to 0 nm.

In a step 515, a depletion voltage (e.g., +5V) and an accumulation voltage (e.g., −5V) are alternatingly applied to probe tip 222 at a selected frequency (e.g., 10-50 kHz) by AC & DC signal generator, sensor, and signal processor block 212.

Then, in a step 520, the change of capacitance $\Delta C (H_X)$ between probe tip 222 and the "plate" formed by the carriers in doped region 12, between the strong accumulation state to the deep depletion state, is measured by AC & DC signal generator, sensor, and signal processor block 212.

In step 525, the normalized change of capacitance $\Delta C_{NORM}(H_X)$ is determined (e.g., by processor 214) according to equation (3) above.

In step 530, a check is made to determine whether measurements at the final height have been made, if not the process increments the height/measurement index "X" at step 535 and returns to step 510. In a beneficial arrangement, measurements may be made up to a final height of 10 nm.

Once measurements have been made at all desired heights, then the process proceeds to step 540 where the measured $\Delta C_{NORM}(H)$ response is determined for the dopant density in the doped region of a substrate being measured.

In step 545, the measured $\Delta C_{NORM}(H)$ response is compared to the normalized capacitance vs. height reference data from step 505, and in step 550, the dopant density in the doped region of a substrate being measured is determined from the comparison. For example, the measured $\Delta C_{NORM}(H)$ response could be plotted on the graph of FIG. 6 to determine the doped density of the measured sample. Alternatively, the comparison and determination could be performed entirely numerically by processor 214 without generating any plots.

Of course details illustrated in method 500 are exemplary. For example, measurements over a range from 0 to 10 nm may not be necessary in all cases to determine the dopant density. In other cases, more measurements and/or a larger height range may be employed. Also, instead of applying the alternating depletion/accumulation voltage and measuring the change in capacitance using a lock-in amplifier, separate accumulation and depletion voltages may be applied and the capacitance may be separately measured in each state. It should also be understood that the order of some of the steps illustrated in FIG. 3 can be rearranged in other orders for convenience. For example: step 505 could be performed after steps 507-535; step 525 could be performed immediately prior to step 540; etc.

The inventor has recognized that the approaches described above with respect to methods 300 and 500 may be applied to SMM reflectance measurements with probe tip 222. In particular, SMM reflectance versus height measurements, or SMM reflectance versus height measurements, may be employed to determine the dopant density in a sample. Furthermore, either the phase or the magnitude of the reflectance at the probe tip due to interaction with the doped region of the substrate may be used to determine dopant density.

Figure 7:
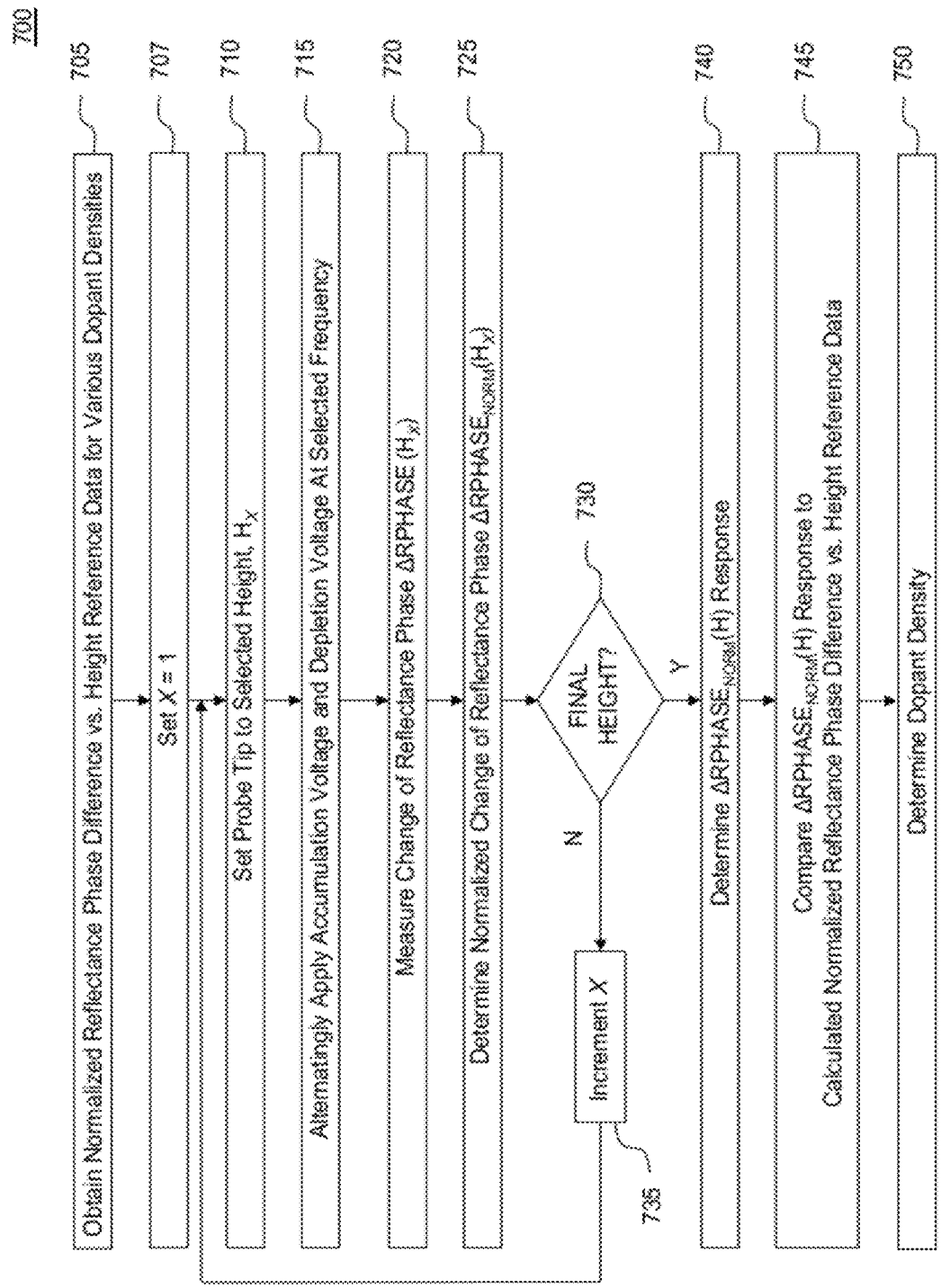
FIG. 7 is a flowchart of a third embodiment of a method of determining a dopant density.

FIG. 7 is a flowchart of a third embodiment of a method 700 of determining a dopant density. Method 700 may be executed by instrument 200 under control of processor 214. Method 700 determines dopant density by measuring a normalized change of reflectance phase at the probe tip, due to an interaction with the doped region, between a strong accumulation voltage and a strong depletion voltage. The normalized change of reflectance phase, $\Delta RPHASE_{NORM}(H)$, may be calculated as:

$$\Delta RPHASE_{NORM}(H)=[RPHASE_{ACC}(H)-RPHASE_{DEP}(H)]/[RPHASE_{ACC}(0)-RPHASE_{DEP}(0)] \quad (4)$$

Measured normalized change of reflectance phase ($\Delta RPHASE$) versus height (H) data, $\Delta RPHASE_{NORM}(H)$, is then compared to normalized $\Delta RPHASE$ vs. H reference data for a variety of different dopant densities to determine the absolute dopant density of the region of the sample substrate on which the measurements are performed.

Specifically, in a first step 705, normalized change of reflectance phase versus height reference data is obtained for various dopant densities. The reference data can be provided in the form of a series of data points, as a curve, as an equation, or in any other convenient form. The reference data may be obtained using similar techniques to those described above with respect to FIG. 3.

Figure 8:
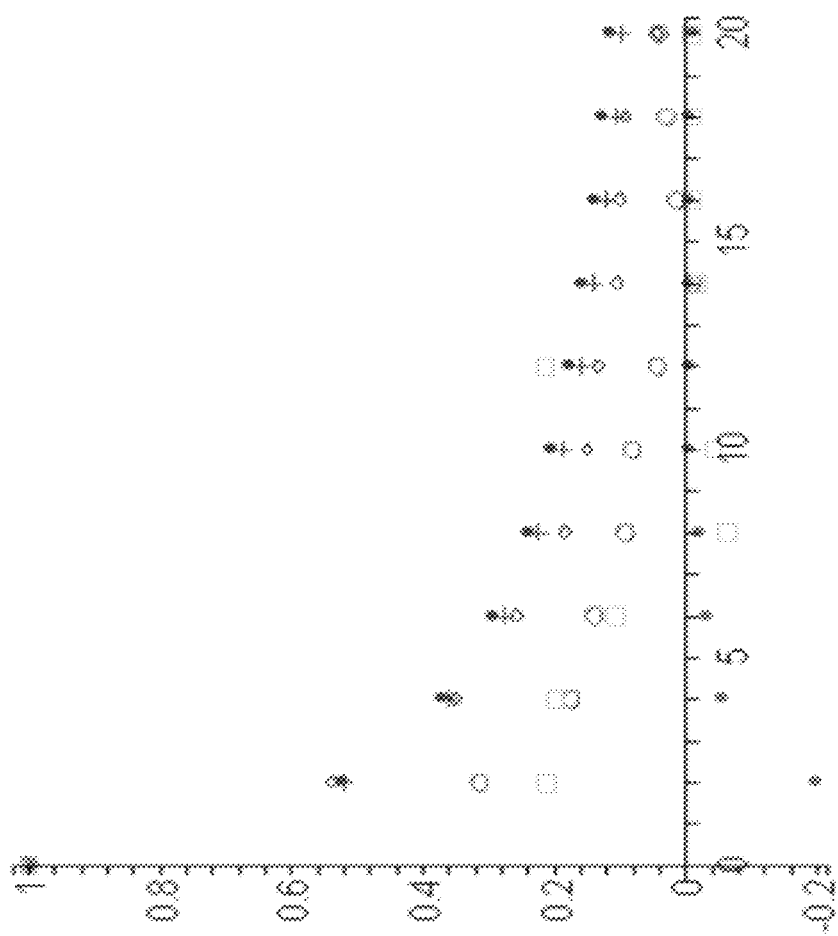
FIG. 8 illustrates a series of normalized reflectance phase difference vs. height curves for various dopant densities.

FIG. 8 illustrates a series of normalized change of reflectance phase vs. height curves for various dopant densities. The parameter set employed in the calculating the data plotted in FIG. 8 include: [Va, Na, tox, R, alpha], where Va is the amplitude of the applied accumulation and depletion voltage, Na is the log of the dopant density (in this example, p-type), tox is the oxide thickness above the doped region (dielectric constant k=3.8), R is the radius of the probe tip, and alpha is the probe cone angle. In the data sets plotted in FIG. 8, Va=5V, fox=3 nm, R=50 nm; and alpha=10 degrees. FIG. 8 plots values for six different data sets corresponding to six different dopant densities where Na is 15, 16, 17, 18, 19 and 20. In FIG. 8, the horizontal axis is in nanometers, ranging from 0 to 20 nm, and the vertical axis is unitless, since all data is normalized.

Turning back to FIG. 7, in a step 707, a height/measurement index "X" is set to 1.

In a step 710, the probe tip is moved by a probe tip movement mechanism (e.g., a motor and/or piezoelectric transducer) to a predetermined height from the doped region of a substrate to be measured, corresponding to the index ("X"). For example, the first height (X=1) may be set to 0 nm.

In a step 715, a depletion voltage (e.g., +5V) and an accumulation voltage (e.g., −5V) are alternatingly applied to probe tip 222 at a selected frequency (e.g., 10-50 kHz) by AC & DC signal generator, sensor, and signal processor block 212.

Then, in a step 720, the change of reflectance phase, $\Delta RPHASE(H_X)=|PHASE_{ACC}(H_X)-PHASE_{DEP}(H_X)|$, between the strong accumulation state and the deep depletion state, due to the interaction between probe tip 222 and the doped carriers is measured by AC & DC signal generator, sensor, and signal processor block 212.

In step 725, the normalized change of reflectance phase $\Delta RPHASE_{NORM}(H_X)$ is determined (e.g., by processor 214) according to equation (4) above.

In step 730, a check is made to determine whether measurements at the final height have been made, if not the process increments the height/measurement index "X" at step 735, and returns to step 710. In a beneficial arrangement, measurements may be made up to a final height of 20 nm.

Once measurements have been made at all desired heights, then the process proceeds to step 740 where the measured $\Delta RPHASE_{NORM}(H)$ response is determined for the dopant density in the doped region of a substrate being measured.

In step 745, the measured $\Delta RPHASE_{NORM}(H)$ response is compared to the normalized reflectance phase difference vs. height reference data from step 705, and in step 750, the dopant density in the doped region of a substrate being measured is determined from the comparison. For example, the measured $\Delta RPHASE_{NORM}(H)$ response could be plotted on the graph of FIG. 8 to determine the doped density of the measured sample. Alternatively, the comparison and determination could be performed entirely numerically by processor 214 without generating any plots.

Of course details illustrated in method 700 are exemplary. For example, measurements over a range from 0 to 20 nm may not be necessary in all cases to determine the dopant density. In other cases, more measurements and/or a larger height range may be employed. Also, instead of applying the alternating depletion/accumulation voltage and measuring the change in reflectance phase using a lock-in amplifier, separate accumulation and depletion voltages may be applied and the reflectance phase may be separately measured in each state. It should also be understood that the order of some of the steps illustrated in FIG. 7 can be rearranged in other orders for convenience. For example: step 705 could be performed after steps 707-735; the order of steps 715 and 720 could be interchanged; step 725 could be performed immediately prior to step 740; etc.

Figure 9:
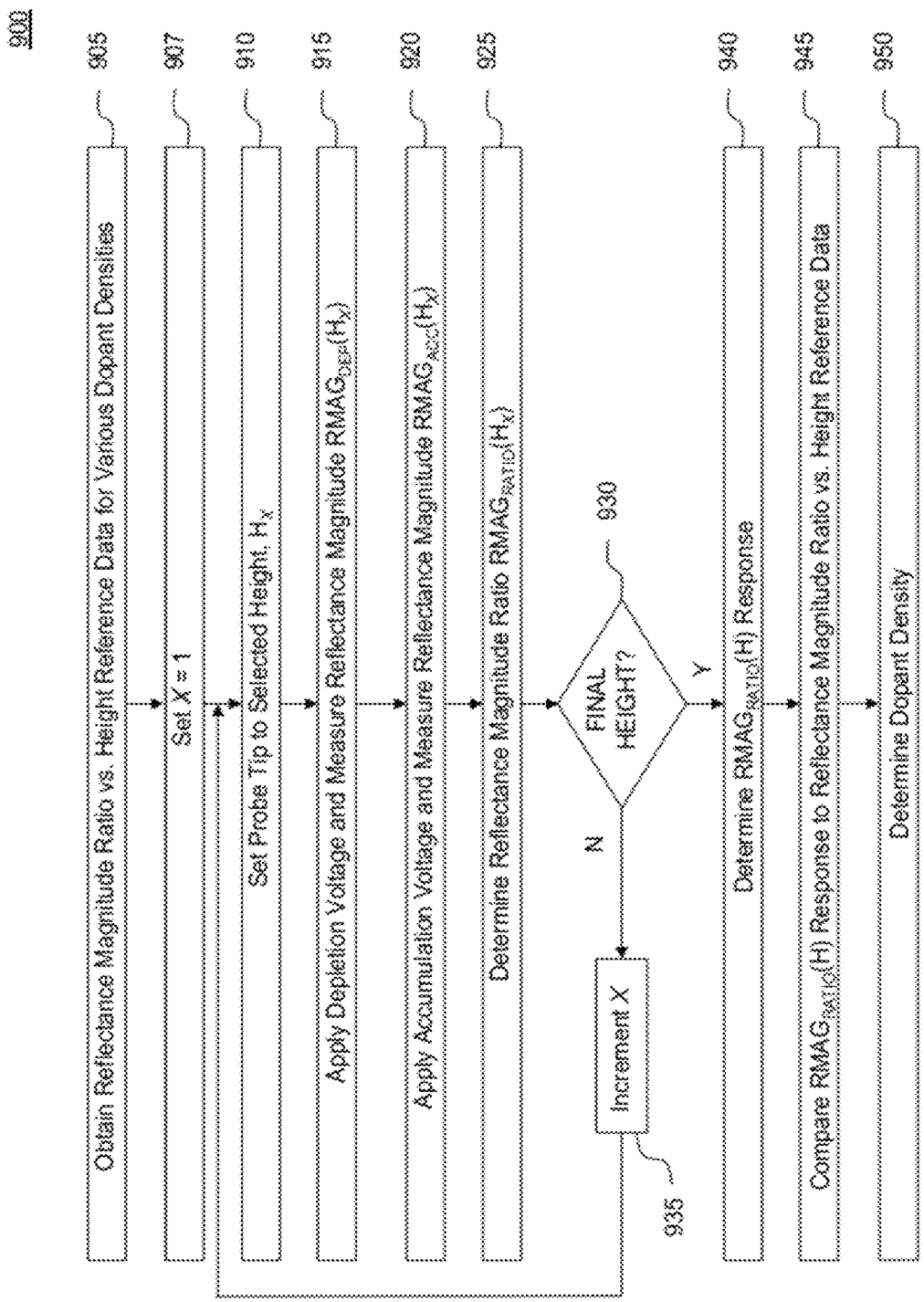
FIG. 9 is a flowchart of a fourth embodiment of a method of determining a dopant density.

FIG. 9 is a flowchart of a fourth embodiment of a method 900 of determining a dopant density. Method 900 may be executed by instrument 200 under control of processor 214. Method 900 determines dopant density by measuring reflectance magnitude ratio at the probe tip, due to an interaction with the doped region, between a strong accumulation voltage and a strong depletion voltage. The reflectance magnitude ratio, $RMAG_{RATIO}(H)$, may be calculated as:

$$RMAG_{RATIO}(H)=RMAG_{DEP}(H)/RMAG_{ACC}(H) \quad (5)$$

Measured reflectance magnitude ratio ($RMAG_{RATIO}$) versus height (H) data, $RMAG_{RATIO}(H)$, is then compared to $RMAG_{RATIO}$ vs. H reference data for a variety of different dopant densities to determine the absolute dopant density of the region of the sample substrate on which the measurements are performed.

Specifically, in a first step 905, reflectance magnitude ratio versus height reference data is obtained for various dopant densities. The reference data can be provided in the form of a series of data points, as a curve, as an equation, or in any other convenient form. The reference data may be obtained using similar techniques to those described above with respect to FIG. 3.

Figure 10:
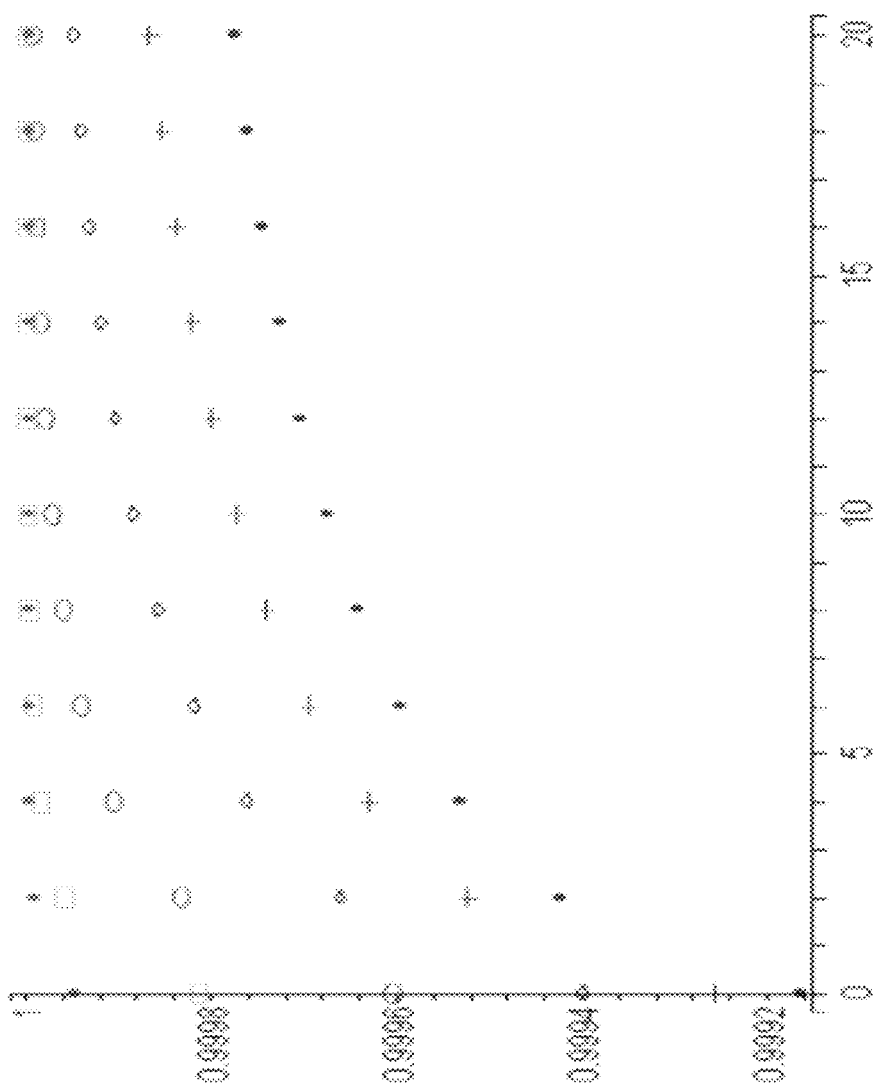
FIG. 10 illustrates a series of reflectance magnitude ratio vs. height curves for various dopant densities.

FIG. 10 illustrates a series of reflectance magnitude ratio vs. height curves for various dopant densities. The parameter set employed in the calculating the data plotted in FIG. 10 include: [Va, Na, tox, R, alpha], where Va is the amplitude of the applied accumulation and depletion voltage, Na is the log of the dopant density (in this example, p-type), tox is the oxide thickness above the doped region (dielectric constant k=3.8), R is the radius of the probe tip, and alpha is the probe cone angle. In the data sets plotted in FIG. 10, Va=5V, tox=3 nm, R=50 nm; and alpha=10 degrees. FIG. 10 plots values for six different data sets corresponding to six different dopant densities where Na is 15, 16, 17, 18, 19 and 20. In FIG. 10, the horizontal axis is in nanometers, ranging from 0 to 20 nm, and the vertical axis is unitless, since all data is normalized.

Turning back to FIG. 9, in a step 907, a height/measurement index "X" is set to 1.

In a step 910, the probe tip is moved by a probe tip movement mechanism (e.g., a motor and/or piezoelectric transducer) to a predetermined height from the doped region of a substrate to be measured, corresponding to the index ("X"). For example, the first height (X=1) may be set to 0 nm.

In a step 915, a depletion voltage (e.g., +5V) is applied to probe tip 222, and the reflectance magnitude $\text{RMAG}_{DEP}(\text{H}_X)$ due to the interaction between probe tip 222 and the doped carriers is measured by AC & DC signal generator, sensor, and signal processor block 212.

Then, in a step 920, an accumulation voltage (e.g., −5V) is applied to probe tip 222, and the reflectance magnitude $\text{RMAG}_{ACC}(\text{H}_X)$ due to the interaction between probe tip 222 and the doped carriers is measured by AC & DC signal generator, sensor, and signal processor block 212.

In step 925, the reflectance magnitude ratio $\text{RMAG}_{RATIO}(\text{H}_X)$ is determined (e.g., by processor 214) according to equation (5) above.

In step 930, a check is made to determine whether measurements at the final height have been made, if not the process increments the height/measurement index "X" at step 935, and returns to step 910. In a beneficial arrangement, measurements may be made up to a final height of 20 nm.

Once measurements have been made at all desired heights, then the process proceeds to step 940 where the measured $\text{RMAG}_{RATIO}(\text{H})$ response is determined for the dopant density in the doped region of a substrate being measured.

In step 945, the measured $\text{RMAG}_{RATIO}(\text{H})$ response is compared to the reflectance magnitude ratio vs. height reference data from step 905, and in step 950, the dopant density in the doped region of a substrate being measured is determined from the comparison. For example, the measured $\text{RMAG}_{RATIO}(\text{H})$ response could be plotted on the graph of FIG. 10 to determine the doped density of the measured sample. Alternatively, the comparison and determination could be performed entirely numerically by processor 914 without generating any plots.

Of course details illustrated in method 900 are exemplary. For example, measurements over a range from 0 to 20 nm may not be necessary in all cases to determine the dopant density. In other cases, more measurements and/or a larger height range may be employed. It should also be understood that the order of some of the steps illustrated in FIG. 9 can be rearranged in other orders for convenience. For example: step 905 could be performed after steps 907-935; the order of steps 915 and 920 could be interchanged; step 925 could be performed immediately prior to step 940; etc.

Figure 11:
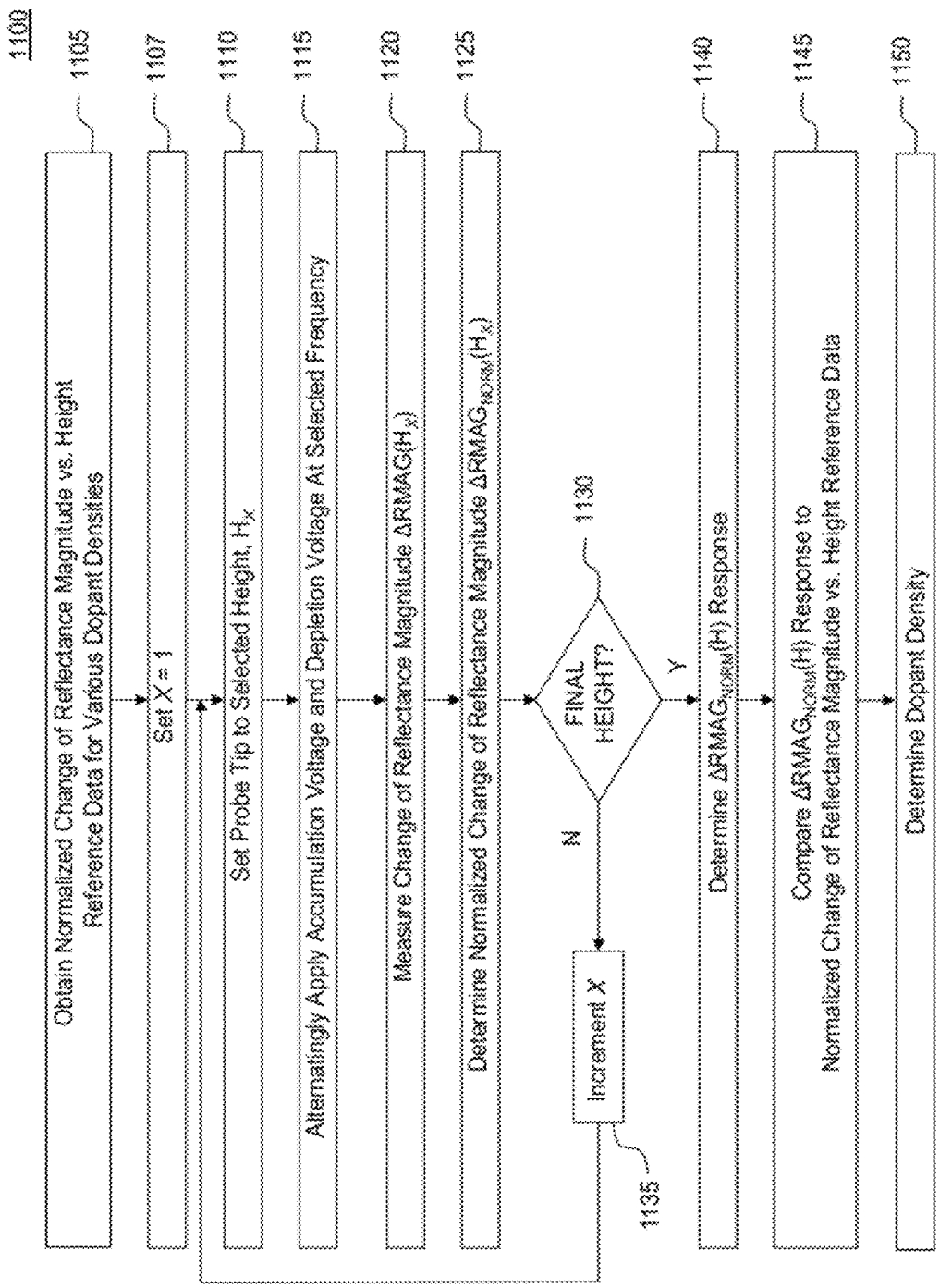
FIG. 11 is a flowchart of a fifth embodiment of a method of determining a dopant density.

FIG. 11 is a flowchart of a fifth embodiment of a method of determining a dopant density. Method 1100 may be executed by instrument 200 under control of processor 214. Method 1100 determines dopant density by measuring normalized change of reflectance magnitude at the probe tip, due to an interaction with the doped region, between a strong accumulation voltage and a strong depletion voltage. The normalized change of reflectance magnitude, $\Delta\text{RMAG}_{NORM}(\text{H})$, may be calculated as:

$$\Delta\text{RMAG}_{NORM}(H)=[\text{RMAG}_{ACC}(H)-\text{RMAG}_{DEP}(H)]/[\text{RMAG}_{ACC}(0)-\text{RMAG}_{DEP}(0)] \quad (6)$$

Measured normalized change of reflectance magnitude ($\Delta\text{RMAG}_{NORM}$) versus height (H) data, $\Delta\text{RMAG}_{NORM}(\text{H})$, is then compared to $\Delta\text{RMAG}_{NORM}$ vs. H reference data for a variety of different dopant densities to determine the absolute dopant density of the region of the sample substrate on which the measurements are performed.

Specifically, in a first step 1105, normalized change of reflectance magnitude versus height reference data is obtained for various dopant densities. The reference data can be provided in the form of a series of data points, as a curve, as an equation, or in any other convenient form. The reference data may be obtained using similar techniques to those described above with respect to FIG. 3.

Figure 12:
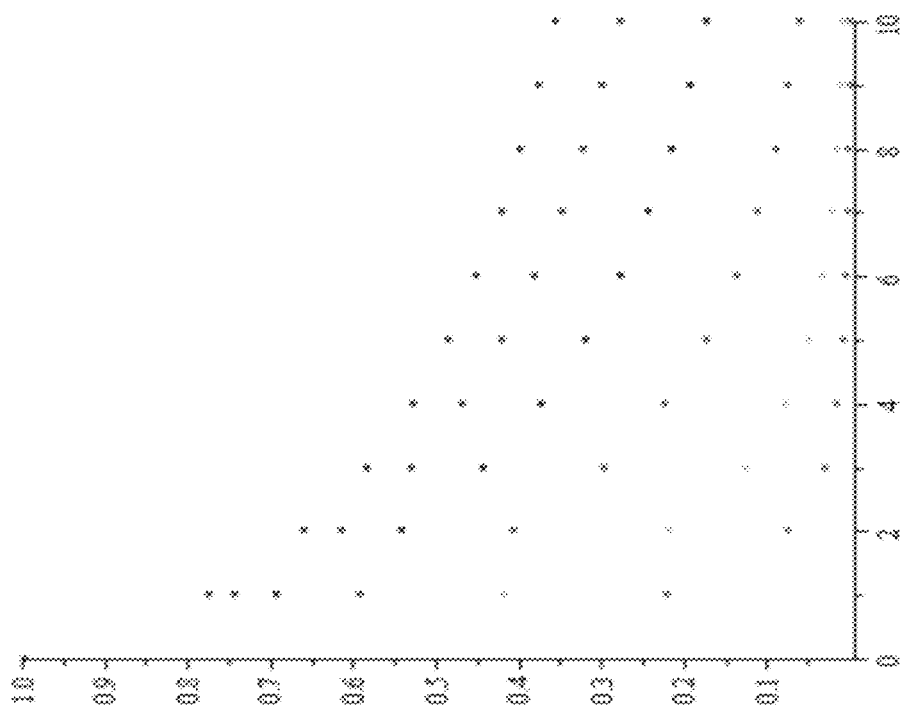
FIG. 12 illustrates a series of change of reflectance magnitude vs. height curves for various dopant densities.

FIG. 12 illustrates a series of normalized change of reflectance magnitude vs. height curves for various dopant densities. The parameter set employed in the calculating the data plotted in FIG. 12 include: [Va, Na, tox, R, alpha], where Va is the amplitude of the applied accumulation and depletion voltage, Na is the log of the dopant density (in this example, p-type), tox is the oxide thickness above the doped region (dielectric constant k=3.8), R is the radius of the probe tip, and alpha is the probe cone angle. In the data sets plotted in FIG. 12, Va=5V, tox=3 nm, R=50 nm; and alpha=10 degrees. FIG. 12 plots values for six different data sets corresponding to six different dopant densities where Na is 15, 16, 17, 18, 19 and 20. In FIG. 12, the horizontal axis is in nanometers, ranging from 0 to 10 nm, and the vertical axis is unitless, since all data is normalized.

Turning back to FIG. 11, in a step 1107, a height/measurement index "X" is set to 1.

In a step 1110, the probe tip is moved by a probe tip movement mechanism (e.g., a motor and/or piezoelectric transducer) to a predetermined height from the doped region of a substrate to be measured, corresponding to the index ("X"). For example, the first height (X=1) may be set to 0 nm.

In a step 1115, a depletion voltage (e.g., +5V) and an accumulation voltage (e.g., −5V) are alternatingly applied to probe tip 222 at a selected frequency (e.g., 10-50 kHz) by AC & DC signal generator, sensor, and signal processor block 212.

Then, in a step 1120, the change of reflectance phase, $\Delta\text{RMAG}(\text{H}_X)=|\text{RMAG}_{ACC}(\text{H}_X)-\text{RMAG}_{DEP}(\text{H}_X)|$, between the strong accumulation state and the deep depletion state, due to the interaction between probe tip 222 and the doped carriers is measured by AC & DC signal generator, sensor, and signal processor block 212.

In step 1125, the normalized change of reflectance magnitude $\Delta\text{RMAG}_{NORM}(\text{H}_X)$ is determined (e.g., by processor 214) according to equation (6) above.

In step 1130, a check is made to determine whether measurements at the final height have been made, if not the process increments the height/measurement index "X" at step 1135, and returns to step 910. In a beneficial arrangement, measurements may be made up to a final height of 20 nm.

Once measurements have been made at all desired heights, then the process proceeds to step 1140 where the measured normalized change of reflectance magnitude $\Delta\text{RMAG}_{NORM}(\text{H})$ response is determined for the dopant density in the doped region of a substrate being measured.

In step 1145, the measured normalized change of reflectance magnitude $\Delta\text{RMAG}_{NORM}(\text{H})$ response is compared to the normalized change of reflectance magnitude vs. height reference data from step 1105, and in step 1150, the dopant density in the doped region of a substrate being measured is determined from the comparison. For example, the measured normalized change of reflectance magnitude $\Delta\text{RMAG}_{NORM}(\text{H})$ response could be plotted on the graph of FIG. 12 to determine the doped density of the measured sample. Alternatively, the comparison and determination could be performed entirely numerically by processor 1114 without generating any plots.

Of course details illustrated in method 1100 are exemplary. For example, measurements over a range from 0 to 10 nm may not be necessary in all cases to determine the dopant density. In other cases, more measurements and/or a larger height range may be employed. Also, instead of applying the alternating depletion/accumulation voltage and measuring the change in reflectance magnitude using a lock-in amplifier, separate accumulation and depletion voltages may be applied and the reflectance magnitude may be separately measured in each state. It should also be understood that the order of some of the steps illustrated in FIG. 11 can be rearranged in other orders for convenience. For example: step 1105 could be performed after steps 1107-1135; the order of steps 1115 and 1120 could be interchanged; step 1125 could be performed immediately prior to step 1140; etc.

Methods 300, 500, 700, 900 and 1100 are merely a few exemplary embodiments of methods that measure the dependency of an electrical interaction between the probe tip and the doped region of the substrate on the height between the probe tip and the top surface or doped region of the substrate in order to determine the dopant density in the doped region. However it should be understood that other measurements and calculations based on the dependency of an electrical interaction between the probe tip and the doped region of the substrate on the height between the probe tip and the top surface or doped region of the substrate could be employed to determine the dopant density in the doped region.

For example, in addition to the methods described in detail above, the following four methods may in principle be employed to characterize an electrical interaction between the probe tip and the doped region of the substrate as a function of height between the probe tip and the doped region of the substrate.

Normalized depletion capacitance versus height:

$$C\text{-DEP}_{NORM}(H) = C_{DEP}(H)/C_{ACC}(0) \quad (7)$$

Normalized reflectance phase ratio versus height:

$$\text{RPHASE}_{RATIO}(H) = \text{RPHASE}_{DEP}(H)/\text{RPHASE}_{ACC}(H) \quad (8)$$

Normalized depletion reflectance phase versus height:

$$\text{RPHASE-DEP}_{NORM}(H) = \text{RPHASE}_{DEP}(H)/\text{RPHASE-}_{ACC}(0) \quad (9)$$

Normalized depletion reflectance magnitude versus height:

$$\text{RMAG-DEP}_{NORM}(H) = \text{RMAG}_{DEP}(H)/\text{RMAG}_{ACC}(0) \quad (10)$$

Also, some example embodiments above measured utilized the magnitude or phase of the reflectance. However, instead of using magnitude or phase, the real or imaginary parts of the reflectance could be used, as it is well known how to convert back and forth between magnitude/phase and real and imaginary parts.

Therefore the invention should not be limited to the particular example embodiments described in detail above.

While example embodiments are disclosed herein, one of ordinary skill in the art appreciates that many variations that are in accordance with the present teachings are possible and remain within the scope of the appended claims. The invention therefore is not to be restricted except within the scope of the appended claims.

The invention claimed is:

1. A method, comprising:
   generating a measured data set, comprising,
   (i) providing a probe tip at a selected height from a doped region of a substrate,
   (ii) applying a probing signal to the probe tip,
   (iii) measuring a characteristic of an electrical interaction between the probe tip and the doped region of the substrate, and
   (iv) repeating steps (i) through (iii) for a plurality of different selected heights;
   providing a plurality of reference data sets characterizing the electrical interaction between the probe tip and the doped region of the substrate as a function of height between the probe tip and the doped region of the substrate, each reference data set corresponding to a different dopant density;
   comparing the measured data set to the plurality of reference data sets to obtain a closest match result; and
   determining a dopant density of the doped region of the substrate from the closest match result.

2. The method of claim 1, wherein the characteristic of the electrical interaction between the probe tip and the doped region of the substrate is a characteristic of a reflectance between the probe tip and the doped region of the substrate.

3. The method of claim 1, wherein applying the probing signal to the probe tip and measuring a characteristic of an electrical interaction between the probe tip and the doped region of the substrate comprises:
   applying a depletion voltage to the probe tip to deplete the doped region, and measuring a depletion capacitance between the probe tip and the doped region of the substrate;
   applying an accumulation voltage to the probe tip to accumulate the doped region, and measuring an accumulation capacitance between the probe tip and the doped region of the substrate; and
   determining a normalized capacitance ratio between the depletion capacitance and the accumulation capacitance.

4. The method of claim 1, wherein applying the probing signal to the probe tip and measuring a characteristic of an electrical interaction between the probe tip and the doped region of the substrate comprises:
   alternatingly applying an accumulation voltage and a depletion voltage at a selected frequency to the probe tip;
   measuring a change in capacitance between the probe tip and the doped region of the substrate in response to the alternatingly applied voltage; and
   determining a normalized change of capacitance between the depletion capacitance and the accumulation capacitance.

5. The method of claim 1, wherein applying the probing signal to the probe tip and measuring a characteristic of an electrical interaction between the probe tip and the doped region of the substrate comprises:
   alternatingly applying an accumulation voltage and a depletion voltage at a selected frequency to the probe tip;
   measuring a change in reflectance phase between the probe tip and the doped region of the substrate in response to the alternatingly applied voltage; and
   determining a normalized reflectance phase difference between the depletion reflectance phase and the accumulation reflectance phase.

6. The method of claim 1, wherein applying the probing signal to the probe tip and measuring a characteristic of an electrical interaction between the probe tip and the doped region of the substrate comprises:
   applying a depletion voltage to the probe tip to deplete the doped region, and measuring a depletion reflectance magnitude;
   applying an accumulation voltage to the probe tip to accumulate the doped region, and measuring an accumulation reflectance magnitude; and
   determining a reflectance magnitude ratio between the depletion reflectance magnitude and the accumulation reflectance magnitude.

7. The method of claim 1, wherein applying the probing signal to the probe tip and measuring a characteristic of an electrical interaction between the probe tip and the doped region of the substrate comprises:

alternatingly applying an accumulation voltage and a depletion voltage at a selected frequency to the probe tip;

measuring a change in reflectance magnitude between the probe tip and the doped region of the substrate in response to the alternatingly applied voltage;

determining a normalized change of reflectance magnitude between the depletion reflectance magnitude and the accumulation reflectance magnitude.

8. The method of claim 1, wherein the characteristic of the electrical interaction between the probe tip and the doped region of the substrate is one of: a normalized depletion capacitance, a normalized reflectance phase ratio, a normalized depletion reflectance phase, and a normalized depletion reflectance magnitude.

9. The method of claim 1, wherein providing the reference data sets characterizing the electrical interaction between the probe tip and the doped region of the substrate as a function of height between the probe tip and the doped region of the substrate are produced from a model of a system comprising the probe tip and the doped region of the substrate, the model employing parametric values for a radius for the probe tip, a cone angle of the probe tip, an applied accumulation voltage, an applied depletion voltage, and an oxide thickness between the probe tip and the doped region of the substrate.

10. The method of claim 1, wherein providing the reference data sets characterizing the electrical interaction between the probe tip and the doped region of the substrate as a function of height between the probe tip and the doped region of the substrate are produced from measurements of one or more reference substrates having a known doping density.

11. An apparatus, comprising:
a probe tip;
a control device configured to move the probe tip with respect to a doped region of a substrate;
a signal processing device configured to apply a probing signal to the probe tip and to sense an electrical interaction between the probe tip and the doped region; and
a processor configured to control the apparatus to perform an algorithm comprising:
generating a measured data set, comprising,
(i) moving the probe tip at a selected height from a doped region of a substrate,
(ii) applying the probing signal to the probe tip,
(iii) measuring a characteristic of an electrical interaction between the probe tip and the doped region of the substrate, and
(iv) repeating steps (i) through (iii) for a plurality of different selected heights;
providing a plurality of reference data sets characterizing the electrical interaction between the probe tip and the doped region of the substrate as a function of height between the probe tip and the doped region of the substrate, each reference data set corresponding to a different dopant density;
comparing the measured data set to the plurality of reference data sets to obtain a closest match result; and
determining a dopant density of the doped region of the substrate from the closest match result.

12. The apparatus of claim 11, wherein applying the probing signal to the probe tip and measuring a characteristic of an electrical interaction between the probe tip and the doped region of the substrate comprises the processor executing an algorithm to cause the apparatus to:
apply a depletion voltage to the probe tip to deplete the doped region, and measure a depletion capacitance between the probe tip and the doped region of the substrate;
apply an accumulation voltage to the probe tip to accumulate the doped region, and measure an accumulation capacitance between the probe tip and the doped region of the substrate; and
determine a normalized capacitance ratio between the depletion capacitance and the accumulation capacitance.

13. The apparatus of claim 11, wherein applying the probing signal to the probe tip and measuring a characteristic of an electrical interaction between the probe tip and the doped region of the substrate comprises the processor executing an algorithm to cause the apparatus to:
alternatingly applying an accumulation voltage and a depletion voltage at a selected frequency to the probe tip;
measuring a change in capacitance between the probe tip and the doped region of the substrate in response to the alternating applied voltage; and
determining a normalized change of capacitance between the depletion capacitance and the accumulation capacitance.

14. The apparatus of claim 11, wherein applying the probing signal to the probe tip and measuring a characteristic of an electrical interaction between the probe tip and the doped region of the substrate comprises:
alternatingly applying an accumulation voltage and a depletion voltage at a selected frequency to the probe tip;
measuring a change in reflectance phase between the probe tip and the doped region of the substrate in response to the alternatingly applied voltage; and
determining a normalized reflectance phase difference between the depletion reflectance phase and the accumulation reflectance phase.

15. The apparatus of claim 11, wherein applying the probing signal to the probe tip and measuring a characteristic of an electrical interaction between the probe tip and the doped region of the substrate comprises:
applying a depletion voltage to the probe tip to deplete the doped region, and measuring a depletion reflectance magnitude;
applying an accumulation voltage to the probe tip to accumulate the doped region, and measuring an accumulation reflectance magnitude; and
determining a reflectance magnitude ratio between the depletion reflectance magnitude and the accumulation reflectance magnitude.

16. The apparatus of claim 11, wherein applying the probing signal to the probe tip and measuring a characteristic of an electrical interaction between the probe tip and the doped region of the substrate comprises:
alternatingly applying an accumulation voltage and a depletion voltage at a selected frequency to the probe tip;
measuring a change in reflectance magnitude between the probe tip and the doped region of the substrate in response to the alternatingly applied voltage;
determining a normalized change of reflectance magnitude between the depletion reflectance magnitude and the accumulation reflectance magnitude.

17. The apparatus of claim 11, wherein the characteristic of the electrical interaction between the probe tip and the doped region of the substrate is one of: a normalized depletion capacitance, a normalized reflectance phase ratio, a normalized depletion reflectance phase, and a normalized depletion reflectance magnitude.

18. The apparatus of claim 11, wherein the control device comprises at least one of a motor and a piezoelectric transducer.

19. The apparatus of claim 11, further comprising a cantilever arm on which the probe tip is disposed.

20. The apparatus of claim 11, wherein the characteristic of the electrical interaction between the probe tip and the doped region of the substrate is a characteristic of a reflectance between the probe tip and the doped region of the substrate.

* * * * *